United States Patent
Datta et al.

(10) Patent No.: US 9,712,119 B2
(45) Date of Patent: Jul. 18, 2017

(54) DOHERTY POWER AMPLIFIER WITH TUNABLE INPUT NETWORK

(71) Applicant: SKYWORKS SOLUTIONS, INC., Woburn, MA (US)

(72) Inventors: Kunal Datta, Los Angeles, CA (US); Reza Kasnavi, Solana Beach, CA (US); Aleksey A. Lyalin, Moorpark, CA (US); Ying Shi, Saratoga, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/921,279

(22) Filed: Oct. 23, 2015

(65) Prior Publication Data

US 2016/0118944 A1  Apr. 28, 2016

Related U.S. Application Data

(60) Provisional application No. 62/068,629, filed on Oct. 25, 2014.

(51) Int. Cl.
| | |
|---|---|
| *H04B 1/38* | (2015.01) |
| *H04B 1/18* | (2006.01) |
| *H03F 1/02* | (2006.01) |
| *H03F 1/56* | (2006.01) |
| *H03F 3/19* | (2006.01) |

(Continued)

(52) U.S. Cl.
CPC ............ *H03F 1/0288* (2013.01); *H03F 1/56* (2013.01); *H03F 3/19* (2013.01); *H03F 3/211* (2013.01); *H03F 3/245* (2013.01); *H03F 3/72* (2013.01); *H04B 1/006* (2013.01); *H04B 1/40* (2013.01); *H03F 2200/111* (2013.01); *H03F 2200/451* (2013.01); *H03F 2203/21106* (2013.01);

(Continued)

(58) Field of Classification Search
CPC ..................................................... H03F 1/0288
USPC ........................................................... 455/73
See application file for complete search history.

(56) References Cited

U.S. PATENT DOCUMENTS

| | | | |
|---|---|---|---|
| 6,320,462 B1 | 11/2001 | Alley | |
| 7,362,170 B2 * | 4/2008 | Louis .................... | H03F 1/0288 330/124 R |

(Continued)

FOREIGN PATENT DOCUMENTS

| | | | |
|---|---|---|---|
| EP | 2624446 A1 * | 7/2013 | |
| KR | 1020050031663 A | 4/2005 | |

OTHER PUBLICATIONS

International Search Report and Written Opinion for PCT/US2015/059594 dated Mar. 28, 2016.

(Continued)

*Primary Examiner* — Tilahun B Gesesse
(74) *Attorney, Agent, or Firm* — Chang & Hale LLP

(57) ABSTRACT

Doherty power amplifier with tunable input network. An input network for a Doherty power amplifier can include a splitter circuit configured to receive a radio-frequency (RF) signal and split the RF signal into a first portion along a first path to a carrier amplifier of the Doherty power amplifier and a second portion along a second path to a peaking amplifier of the Doherty power amplifier. The input network can further include a tunable input circuit implemented along either or both of the first path and second path. The (Continued)

tunable input circuit can be configured to provide control of the amplitude and phase of either or both of the first portion and second portion.

20 Claims, 5 Drawing Sheets

(51) Int. Cl.
*H03F 3/21* (2006.01)
*H04B 1/40* (2015.01)
*H03F 3/24* (2006.01)
*H03F 3/72* (2006.01)
*H04B 1/00* (2006.01)
*H04B 1/04* (2006.01)

(52) U.S. Cl.
CPC ........... *H03F 2203/7209* (2013.01); *H04B 2001/0408* (2013.01)

(56) References Cited

U.S. PATENT DOCUMENTS

| | | | |
|---|---|---|---|
| 7,773,959 | B1 | 8/2010 | Bachhuber |
| 8,340,606 | B2 | 12/2012 | Park |
| 8,593,219 | B1 | 11/2013 | Root |
| 8,837,629 | B2 | 9/2014 | Ghannouchi |
| 8,928,404 | B2 | 1/2015 | Khanifar |
| 9,083,284 | B2 | 7/2015 | Maslennikov |
| 9,225,291 | B2 | 12/2015 | Ahmed |
| 9,331,638 | B2* | 5/2016 | Chen ............... H03F 1/0288 |
| 2002/0102971 | A1 | 8/2002 | Jayaraman |
| 2002/0186079 | A1 | 12/2002 | Kobayashi |
| 2003/0201833 | A1* | 10/2003 | Pengelly ............... H03F 1/0277 330/295 |
| 2003/0210096 | A1* | 11/2003 | Pengelly ............... H03F 1/0277 330/295 |
| 2009/0212850 | A1* | 8/2009 | Aipperspach .......... G11C 29/02 327/525 |
| 2009/0278599 | A1* | 11/2009 | Pengelly ................. H03F 3/604 330/124 R |
| 2010/0026387 | A1* | 2/2010 | Blednov ................. H03F 3/195 330/124 R |
| 2011/0080215 | A1 | 4/2011 | Meng |
| 2011/0158081 | A1 | 6/2011 | Wang et al. |
| 2011/0182319 | A1 | 7/2011 | Hua |
| 2011/0279178 | A1* | 11/2011 | Outaleb ................ H03F 1/0288 330/124 R |
| 2013/0027272 | A1 | 1/2013 | Karthaus |
| 2013/0040586 | A1* | 2/2013 | Oliaei ................... H03F 1/0222 455/114.2 |
| 2013/0093534 | A1 | 4/2013 | Mei |
| 2013/0154729 | A1 | 6/2013 | Folkmann |
| 2013/0181773 | A1* | 7/2013 | Liu ........................... H03F 3/68 330/124 R |
| 2014/0070883 | A1 | 3/2014 | Gurvich |
| 2014/0077874 | A1 | 3/2014 | Ahmed |
| 2015/0002227 | A1 | 1/2015 | Pribble |
| 2015/0091653 | A1* | 4/2015 | Kobayashi ............ H03F 1/0288 330/295 |
| 2016/0049910 | A1* | 2/2016 | Datta .................... H03F 1/0288 333/124 |

OTHER PUBLICATIONS

International Search Report and Written Opinion for PCT/US2015/040098 dated Nov. 24, 2015.

* cited by examiner

DOHERTY POWER AMPLIFIER WITH TUNABLE INPUT NETWORK

CROSS-REFERENCE TO RELATED APPLICATION(S)

This application claims priority to U.S. Provisional Application No. 62/068,629 filed Oct. 25, 2014, entitled PROGRAMMABLE INPUT NETWORK WITH AMPLITUDE AND PHASE CONTROL FOR LINEARIZED BROADBAND DOHERTY POWER AMPLIFIER, the disclosure of which is hereby expressly incorporated by reference herein in its entirety.

BACKGROUND

Field

The present disclosure generally relates to radio-frequency (RF) power amplifiers (PAs).

Description of the Related Art

Multimode/multiband (MMMB) power amplifier modules (PAM) can face competition from envelope tracking (ET) PAMs in, for example, the 4G LTE market. To be successful in such a market, it is desirable for MMMB PAMs to provide significant performance improvements over existing MMMB PAMs and also to be able to compete with ET-based PAMs (e.g., based on cost, performance and size).

In the 4G LTE standard, newer modulation protocols such as OFDMA (orthogonal frequency-division multiple access) and SC-FDMA (single carrier FDMA) can be used to support high data-rate in scalable channel bandwidths of, for example, 5 MHz-20 MHz and even 40 MHz. High data rate transmission using a number of independently modulated subcarriers over a variable channel bandwidth in 4G LTE communication protocol typically comes at a cost of high peak to average power ratio (PAPR) for the transmitter. From the perspective of the power amplifier, a high PAPR modulation scheme typically translates into low average efficiency as the power amplifier typically needs to operate in deep-back-off mode most of the time, away from its peak efficiency point, to prevent clipping of transmitted signals. Accordingly, newer architecture of power amplifiers are desirable for 4G standards that can operate with high linearity and high PAE even under significant back-off conditions.

Compared to envelope tracking PAMs for efficiency enhancement under back-off, Doherty PAMs are capable of meeting high efficiency with high linearity under back-off with much reduced system complexity and reduced calibration and digital pre-distortion (DPD) specifications. However, some Doherty power amplifier architectures are bandwidth limited due to the narrowband nature of existing Doherty power combiners. Further, some Doherty PAMs can have large AM-AM (amplitude-modulation-to-amplitude-modulation) and AM-PM (amplitude-modulation -to-phase-modulation)distortion at back-off due to dynamically changing load-lines, which can affect the FOM (figure of merit) achievable at rated power levels for 4G LTE communication standards. For a broad-band Doherty PAM, being able to control such distortions at back-off conditions can be desirable, especially when implemented over wide-band.

SUMMARY

In accordance with some implementations, the present disclosure relates to an input network for a Doherty power amplifier. The input network includes a splitter circuit configured to receive a radio-frequency (RF) signal and split the RF signal into a first portion along a first path to a carrier amplifier of the Doherty power amplifier and a second portion along a second path to a peaking amplifier of the Doherty power amplifier. The input network further includes a tunable input circuit implemented along either or both of the first path and second path. The tunable input circuit is configured to provide control of the amplitude and phase of either or both of the first portion and second portion.

In some embodiments, the tunable input circuit can include an RC circuit. In some embodiments, the RC circuit can include a first capacitor along the first path, a first resistor in a shunt configuration between the first capacitor and the carrier amplifier, a second resistor along the second path, and a second capacitor in a shunt configuration between the second resistor and the peaking amplifier. In some embodiments, the first capacitor, first resistor, second capacitor, and second resistor can each be tunable. In some embodiments, the first capacitor and second capacitor can each include a switchable capacitor bank and the first resistor and second resistor can each include a switchable resistor bank.

In some embodiments, the tunable input circuit can include an RLC circuit. In some embodiments, the RLC circuit can include a capacitor along the first path, a first resistor along the first path, an inductor along the second path, and a second resistor along the second path. In some embodiments, the capacitor and the inductor can be configured to provide control of the phase of either or both of the first portion and second portion and the first resistor and second resistor can be configured to provide control of the amplitude of either or both of the first portion and second portion.

In some embodiments, the tunable input circuit can include a balun-based circuit. In some embodiments, the balun-based circuit can include a balun having a first node configured to receive the input signal, a second node coupled to the carrier amplifier via a first resistor, a third node coupled to the peaking amplifier via a second resistor, and a forth node coupled to a ground potential via a termination impedance. The balun-based circuit can further include a first capacitor coupled between the first node and the third node and a second capacitor coupled between the second node and the fourth node. In some embodiments, the balun cam include a first inductor coupled between the first node and the second node and a second inductor coupled between the third node and the fourth node.

In some embodiments, the input network can further include a controller configured to tune the tunable input network. In some embodiments, the controller can be configured to tune the tunable input network based on a frequency of the RF signal. In some embodiments, the controller can be configured to tune the tunable input network such that the amplitude of the first portion and the amplitude of the second portion are unequal. In some embodiments, the controller can be configured to tune the tunable input network such that phase of the first portion and the phase of the second portion are non-orthogonal. In some embodiments, the controller can be configured to tune the tunable input network such that harmonics produced by the carrier amplifier and harmonics produced by the peaking amplifier are cancelled by a combiner. In some embodiments, the controller can be configured to perform wide-band linearization of the Doherty power amplifier.

In some implementations, the present disclosure relates to a Doherty power amplifier module including a packaging substrate configured to receive a plurality of components.

The Doherty power amplification module includes a Doherty PA system implemented on the packaging substrate. The Doherty PA system including a splitter circuit configured to receive a radio-frequency (RF) signal and split the RF signal into a first portion along a first path and a second portion along a second path. The Doherty PA system includes a tunable input circuit implemented along either or both of the first path and second path. The tunable input circuit is configured to provide control of the amplitude and phase of either or both of the first portion and second portion. The Doherty PA system includes a carrier amplifier configured to amplify the first portion and a peaking amplifier configured to amplify the second portion. The Doherty PA includes an output circuit configured to combine outputs of the carrier amplifier and the peaking amplifier to yield an amplified RF signal.

In some embodiments, the output circuit includes a tunable impedance circuit.

In some implementations, the present disclosure relates to a wireless device including a transceiver configured to generate a radio-frequency (RF) signal. The wireless device includes a power amplifier (PA) module in communication with the transceiver. The PA module includes a packaging substrate configured to receive a plurality of components and a PA system implemented on the packaging substrate. The PA system includes a splitter circuit configured to receive a radio-frequency (RF) signal and split the RF signal into a first portion along a first path and a second portion along a second path. The PA system includes a tunable input circuit implemented along either or both of the first path and second path. The tunable input circuit is configured to provide control of the amplitude and phase of either or both of the first portion and second portion. The PA system includes a carrier amplifier configured to amplify the first portion and a peaking amplifier configured to amplify the second portion. The PA system includes an output circuit configured to combine outputs of the carrier amplifier and the peaking amplifier to yield an amplified RF signal. The wireless device includes The wireless device further includes an antenna in communication with the PA module. The antenna is configured to facilitate transmission of the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/824,856, entitled DOHERTY POWER AMPLIFIER COMBINER WITH TUNABLE IMPEDANCE TERMINATION CIRCUIT, filed on Aug. 12, 2015, and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Figure 1:
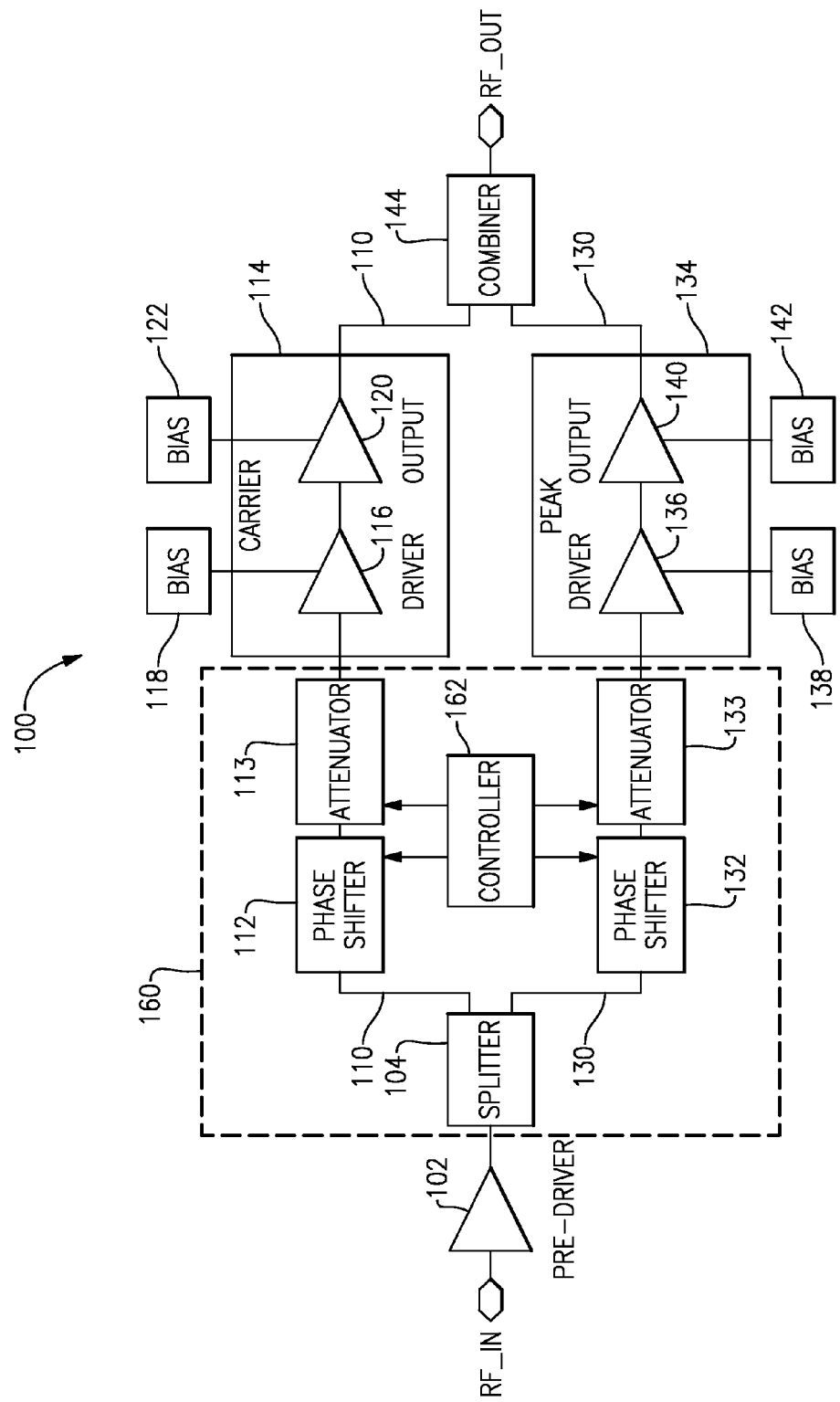
FIG. 1 shows an example architecture of a Doherty power amplifier.

FIG. 1 shows an example architecture of a Doherty power amplifier 100. The example power amplifier 100 is shown to include an input port (RF_IN) for receiving an RF signal to be amplified. Such an input RF signal can be partially amplified by a pre-driver amplifier 102 before being split (e.g., by a splitter 104) into a carrier amplification path 110 and a peaking amplification path 130.

In FIG. 1, the carrier amplification path 110 is shown to include a phase shifter 112, an attenuator 113, and amplification stages collectively indicated as 114. The amplification stages 114 are shown to include a driver stage 116 and an output stage 120. The driver stage 116 is shown to be biased by a driver bias circuit 118, and the output stage 120 is shown to be biased by an output bias circuit 122. In some embodiments, there may be more or fewer amplification stages. In various examples described herein, the amplification stages 114 are sometimes described as an amplifier; however, it will be understood that such an amplifier can include one or more stages.

In FIG. 1, the peaking amplification path 130 is shown to include phase shifter 132, an attenuator 133, and amplification stages collectively indicated as 134. The amplification stages 134 are shown to include a driver stage 136 and an output stage 140. The driver stage 136 is shown to be biased by a driver bias circuit 138, and the output stage 140 is shown to be biased by an output bias circuit 142. In some embodiments, there may be more or fewer amplification stages. In various examples described herein, the amplification stages 134 are sometimes described as an amplifier; however, it will be understood that such an amplifier can include one or more stages.

FIG. 1 further shows that the carrier amplification path 110 and the peaking amplification path 130 can be combined by a combiner 144 so as to yield an amplified RF signal at an output port (RF_OUT). In some implementations, the combiner 144 includes a tunable impedance circuit. Examples related to the combiner 144 are described in greater detail in U.S. patent application Ser. No. 14/824,856, entitled DOHERTY POWER AMPLIFIER COMBINER WITH TUNABLE IMPEDANCE TERMINATION CIRCUIT, filed on Aug. 12, 2015, and hereby incorporated by reference herein in its entirety.

In some Doherty PA implementations, the input to the carrier amplifier 114 and the peaking amplifier 134 are equal in amplitude and orthogonal in phase to ensure the load-line modulates as a function of output power resulting in high efficiency under back-off. However, such implementations can suffer from high AM-AM and AM-PM distortions, often arising from the sharp turn-off of the peaking amplifier 134 causing the carrier amplifier 114 load-line to change dynamically.

The abrupt change of the carrier amplifier 114 load-line and resulting change to the current through the carrier amplifier 114 can cause the intrinsic parasitics (e.g., the collector-base and base-emitter capacitances of a transistor within the carrier amplifier 114) to change drastically. The non-linear nature of such change can result in AM-AM and AM-PM distortions.

In a wideband Doherty PAM, the frequency response of the combiner 144 and splitter 104 can cause such AM-AM and AM-PM distortion to have a frequency dependency. Thus, in some implementations, improved linearity can be achieved by using a tunable input network 160 (also referred to as programmable input network).

The tunable input network 160 includes a controller 162 that tunes the phase shifter 112, 132 and attenuator 113, 133 of each path such that the inputs to the carrier amplifier 114 and peaking amplifier 134 are unequal in amplitude and non-orthogonal in phase.

The controller 162 can control the attenuator 113, 133 of each path to change the amplitude of the signals input to the carrier amplifier 114 and the peaking amplifier 134. In particular, the controller 162 can control the attenuator 113, 133 of each path such that the output current of the carrier amplifier 114 and the output current of the peaking amplifier 134 are in the correct proportion over a wide range of frequencies. The controller 162 can ensure that the carrier amplifier 114 and the peaking amplifier 134 have the same dynamical load-line over a wide range of frequencies, removing the frequency dependence of the AM-AM and AM-PM distortion. To that end, the controller 162 can control the attenuator 113, 133 of each path based on a frequency of the signal received at the input port (e.g., based on a control signal indicative of the frequency of the input signal).

The phase response of the carrier amplifier 114 and the peaking amplifier 134 changes as the collector-base and base-emitter capacitance of transistors of the carrier amplifier 114 and peaking amplifier 134 vary due to the dynamic load-line. The controller 162 can control the phase shifter 112, 132 of each path to change the relative phase of the signals input to the carrier amplifier 114 and the peaking amplifier 134. In particular, the controller 162 can control the phase shifter 112, 132 of each path such that the overall carrier amplifier 114 and peaking amplifier 134 transfer function (from the input of the phase shifter to the output of the amplifier) remains substantially constant over frequency. The controller 162 can control the phase shifter 112, 132 of each path in a suitable manner to cancel out the AM-AM and AM-PM distortions. To that end, the controller 162 can control the phase shifter 112, 132 of each path based on a frequency of the signal received at the input port (e.g., based on a control signal indicative of the frequency of the input signal).

Thus, the controller 162 can linearize the Doherty power amplifier 100 by appropriately controlling the amplitude and phase difference of the input to the carrier amplifier 114 and the peaking amplifier 134 to ensure that carrier amplifier 114 harmonics and peaking amplifier 134 harmonics are in the right amplitude and phase to get cancelled out in the final combined Doherty PAM output. By controlling the amplitude and phase of the harmonics from the input side, the Doherty power amplifier can use low-Q, low breakdown components, leading to cost benefits. By maintaining the right amplitude and phase difference over a wide range of frequencies through controller of the tunable input network, the controller 162 can compensate for any effect on the distortion mechanism caused by the frequency response of the splitter 104 and/or combiner 144.

Figure 2:
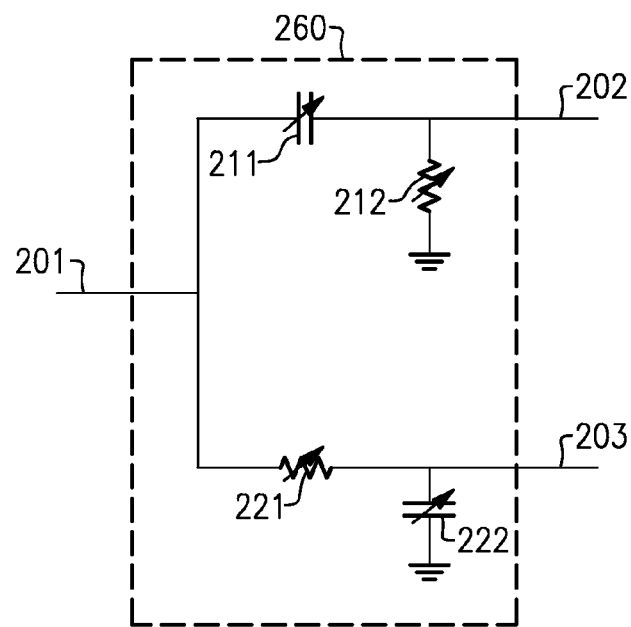
FIG. 2 shows that, in some embodiments, a tunable input network can include an RC circuit.

FIG. 2 shows that, in some embodiments, a tunable input network 260 can include an RC circuit. The tunable input network 260 includes an input node 201 configured to receive an input signal, a carrier output node 202 configured to output a first portion of the input signal (e.g., a carrier signal) to a carrier amplifier, and a peaking output node 203 configured to output a second portion of the input signal (e.g., a peaking signal) to a peaking amplifier.

The tunable input network 260 includes a first path from the input node 201 to the carrier output node 202 and a second path from the input node 201 to the peaking output node 203. The tunable input network 260 includes a first capacitor 211 along the first path, a first resistor 212 in a shunt configuration between the first capacitor 211 and the carrier output node 202, a second resistor 221 along the second path, and a second capacitor 222 in a shunt configuration between the second resistor 221 and the peaking output node 203.

The first capacitor 211, first resistor 212, second capacitor 222, and second resistor 221 are each tunable. In some implementations, the first capacitor 211 and second capacitor 222 each include a switchable capacitor bank and the first resistor 212 and second resistor 221 each include a switchable resistor bank.

The capacitance of the first capacitor 211 and second capacitor 222 and the resistance of the first resistor 212 and second resistor 221 can be controlled (e.g., by a controller) to change the amplitude and phase of the carrier signal and peaking signal. In particular, the carrier signal and peaking signal can be unequal in amplitude and non-orthogonal in phase.

Figure 3:
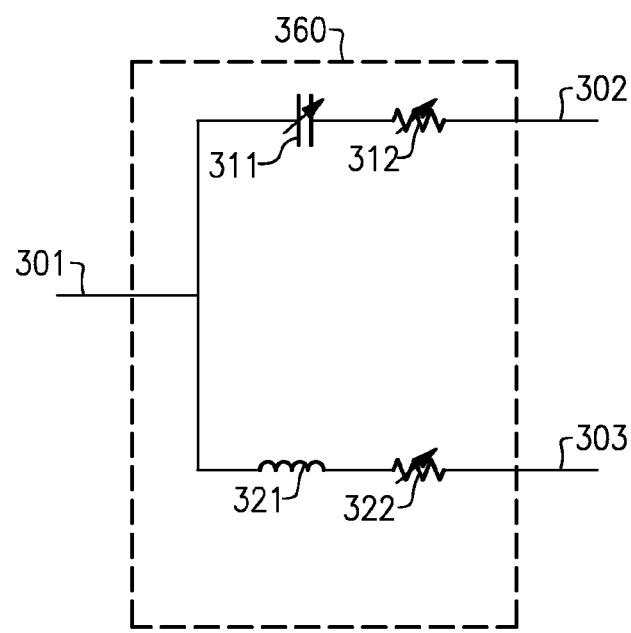
FIG. 3 shows that, in some embodiments, a tunable input network can include an RLC circuit.

FIG. 3 shows that, in some embodiments, a tunable input network 360 can include an RLC circuit. The tunable input network 360 includes an input node 301 configured to receive an input signal, a carrier output node 302 configured to output first portion of the input signal (e.g., a carrier signal) to a carrier amplifier, and a peaking output node 303 configured to output a second portion of the input signal (e.g., a peaking signal) to a peaking amplifier.

The tunable input network 360 includes a first path from the input node 301 to the carrier output node 302 and a second path from the input node 301 to the peaking output node 303. The tunable input network 360 includes a capacitor 311 along the first path, a first resistor 312 along the first path, an inductor 321 along the second path, and a second resistor 322 along the second path.

The capacitor 311, first resistor 312, and second resistor 322 are each tunable. In some implementations, the inductor 321 is tunable. In some implementations, the capacitor 311 includes a switchable capacitor bank and the first resistor 312 and second resistor 322 each include a switchable resistor bank.

The capacitance of the capacitor 311 can be controlled (e.g., by a controller) to change the relative phase of the carrier signal and peaking signal. In particular, the carrier signal and peaking signal can be non-orthogonal in phase. The resistance of the first resistor 312 and second resistor 322 can be controlled (e.g., by a controller) to change the amplitude of the carrier signal and peaking signal. In particular, the carrier signal and peaking signal can be unequal in amplitude.

Figure 4:
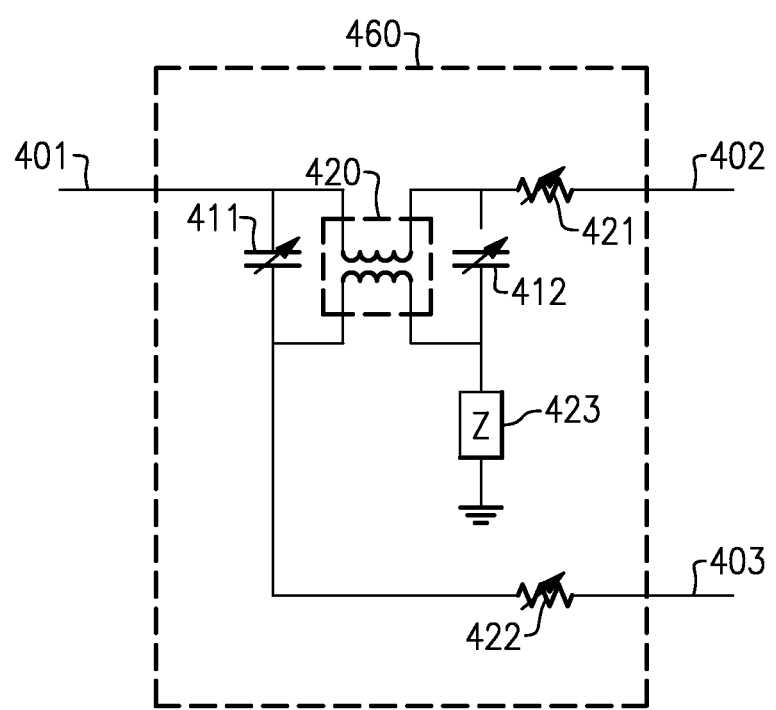
FIG. 4 shows that, in some embodiments, a tunable input network can include a balun-based circuit.

FIG. 4 shows that, in some embodiments, a tunable input network 460 can include a balun-based circuit. The tunable input network 460 includes an input node 460 configured to receive an input signal, a carrier output node 402 configured to output a first portion of the input signal (e.g., a carrier signal) to a carrier amplifier, and a peaking output node 403 configured to output a second portion of the input signal (e.g., a peaking signal) to a peaking amplifier.

The tunable input network 460 includes a first path from the input node 401 to the carrier output node 402 and a second path from the input node 401 to the peaking output node 403. The tunable input network 460 includes a balun 420 having a first node coupled to the input node 401 and configured to receive the input signal, a second node coupled to the carrier output node 402 via a first resistor 421, a third node coupled to the peaking output node 403 via a second resistor 422, and a forth node coupled to a ground potential via a termination impedance 423. The tunable input network 460 further includes a first capacitor 411 coupled between the first node of the balun 420 and the third node of the balun 420 and a second capacitor 412 coupled between the second node of the balun 420 and the fourth node of the balun 420. The balun 420 includes a first inductor coupled between the first node and the second node and a second inductor coupled between the third node and the fourth node.

The first capacitor 411, second capacitor 412, first resistor 421, and second resistor 422 are each tunable. In some implementations, the termination impedance 423 is tunable. In some implementations, the first capacitor 411 and second capacitor 412 each include a switchable capacitor bank and the first resistor 421 and second resistor 422 each include a switchable resistor bank.

The capacitance of the first capacitor 411 and second capacitor 412 and the resistance of the first resistor 421 and second resistor 422 can be controlled (e.g., by a controller) to change the amplitude and phase of the carrier signal and peaking signal. In particular, the carrier signal and peaking signal can be unequal in amplitude and non-orthogonal in phase.

Figure 5:
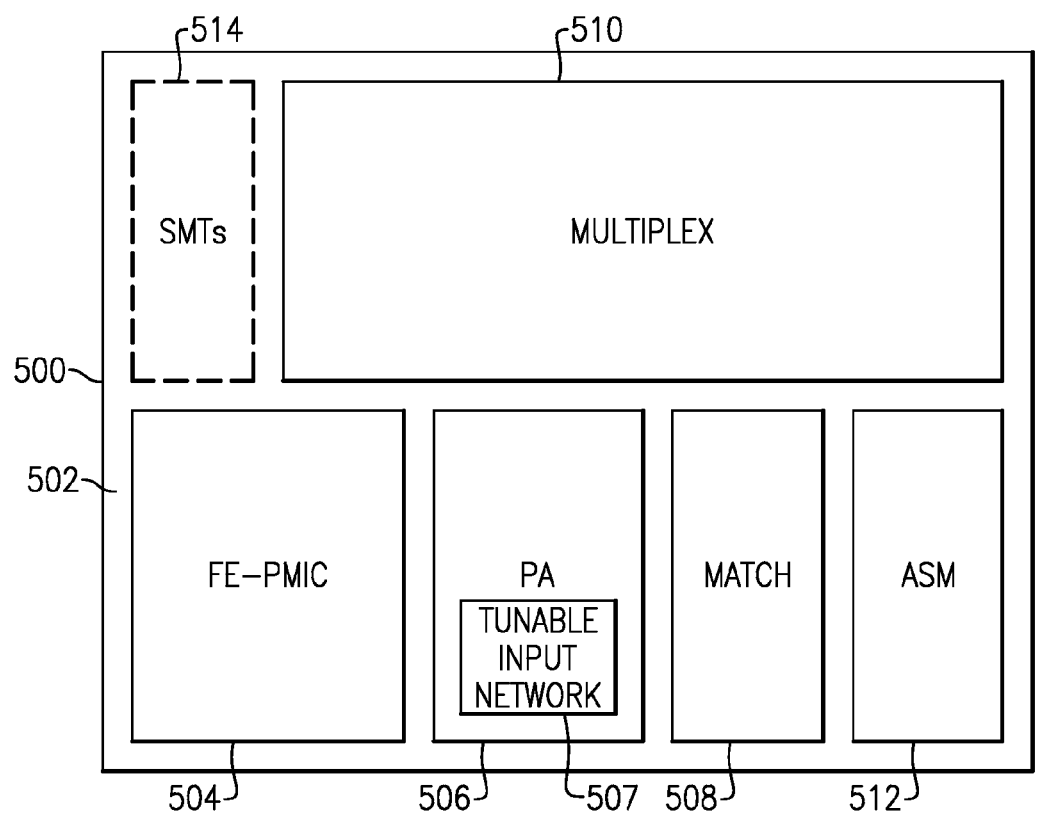
FIG. 5 depicts a module having one or more features as described herein.

FIG. 5 shows that in some embodiments, some or all of the configurations (e.g., those shown in FIGS. 1-4) can be implemented, wholly or partially, in a module. Such a module can be, for example, a front-end module (FEM). In the example of FIG. 5, a module 500 can include a packaging substrate 502, and a number of components can be mounted on such a packaging substrate 502. For example, an FE-PMIC component 504, a power amplifier assembly 506 (which can include a tunable input network 507), a match component 508, and a multiplexer assembly 510 can be mounted and/or implemented on and/or within the packaging substrate 502. Other components such as a number of SMT devices 514 and an antenna switch module (ASM) 512 can also be mounted on the packaging substrate 502. Although all of the various components are depicted as being laid out on the packaging substrate 502, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 6:
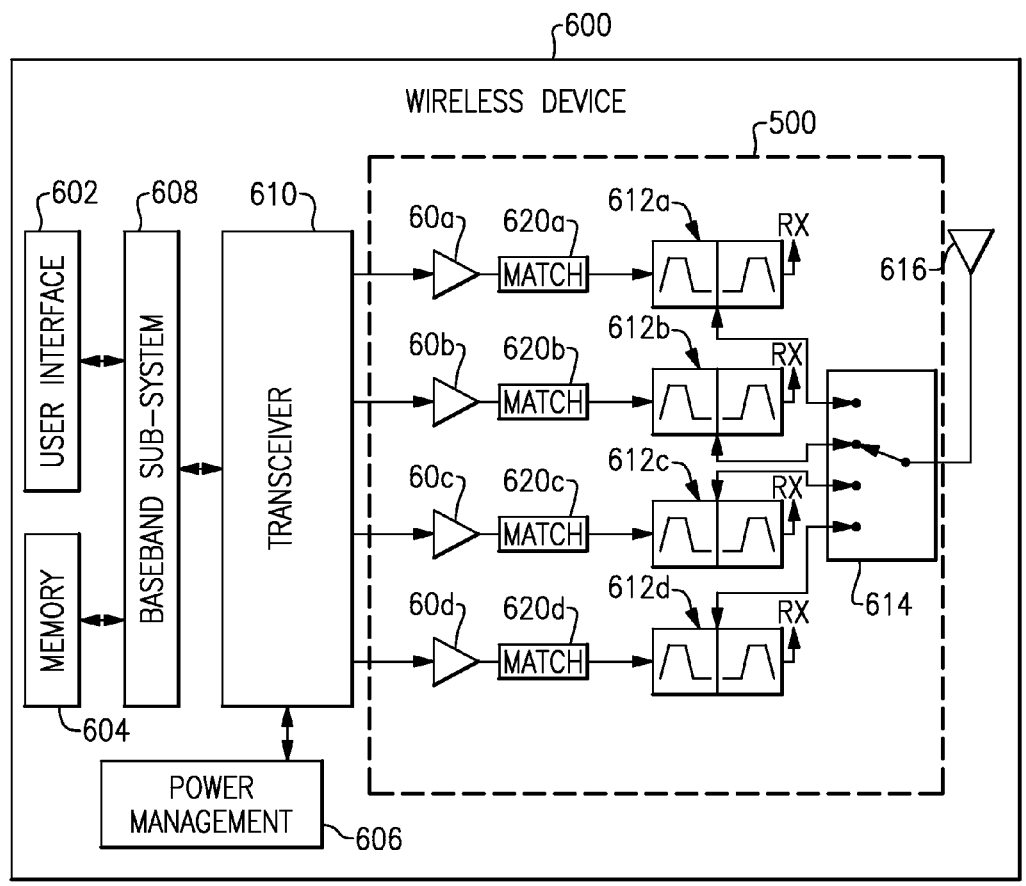
FIG. 6 depicts a wireless device having one or more features described herein.

FIG. 6 depicts an example wireless device 600 having one or more advantageous features described herein. In the context of a module having one or more features as described herein, such a module can be generally depicted by a dashed box 500, and can be implemented as, for example, a front-end module (FEM).

Referring to FIG. 6, power amplifiers (PAs) 60a-60d can receive their respective RF signals from a transceiver 610 that can be configured and operated in known manners to generate RF signals to be amplified and transmitted, and to process received signals. The transceiver 610 is shown to interact with a baseband sub-system 608 that is configured to provide conversion between data and/or voice signals suitable for a user and RF signals suitable for the transceiver 610. The transceiver 610 can also be in communication with a power management component 606 that is configured to manage power for the operation of the wireless device 600. Such power management can also control operations of the baseband sub-system 608 and the module 500.

The baseband sub-system 608 is shown to be connected to a user interface 602 to facilitate various input and output of voice and/or data provided to and received from the user. The baseband sub-system 608 can also be connected to a memory 604 that is configured to store data and/or instructions to facilitate the operation of the wireless device, and/or to provide storage of information for the user.

In the example wireless device 600, outputs of the PAs 60a-60d are shown to be matched (via respective match circuits 620a-620d) and routed to their respective diplexers 612a-612d. Such amplified and filtered signals can be routed to an antenna 616 (or multiple antennas) through an antenna switch 614 for transmission. In some embodiments, the diplexers 612a-612d can allow transmit and receive operations to be performed simultaneously using a common antenna (e.g., 616). In FIG. 6, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A circuit network for a Doherty power amplifier, the circuit network comprising:
a splitter circuit configured to receive a radio-frequency (RF) signal and split the RF signal into a first portion along a first path to an input of a carrier amplifier of the Doherty power amplifier and a second portion along a second path to an input of a peaking amplifier of the Doherty power amplifier; and
a tunable circuit comprising at least one of a section of the first path and a section of the second path, the tunable circuit configured to provide control of the amplitude and phase of at least one of the first portion and second portion, the tunable circuit including a balun-based circuit, the balun-based circuit including a balun having a first node configured to receive the input signal, a second node coupled to the carrier amplifier via a first resistor, a third node coupled to the peaking amplifier via a second resistor, and a fourth node coupled to a ground potential via a termination impedance, the balun-based circuit further including a first capacitor coupled between the first node and the third node and a second capacitor coupled between the second node and the fourth node.

2. The circuit network of claim 1 wherein the tunable circuit includes an RC circuit.

3. The circuit network of claim 2 wherein the RC circuit includes the first capacitor along the first path, the first resistor in a shunt configuration between the first capacitor and the carrier amplifier, the second resistor along the second path, and the second capacitor in a shunt configuration between the second resistor and the peaking amplifier.

4. The circuit network of claim 3 wherein the first capacitor, first resistor, second capacitor, and second resistor are each tunable.

5. The circuit network of claim 4 wherein the first capacitor and second capacitor each includes a switchable capacitor bank and the first resistor and second resistor each includes a switchable resistor bank.

6. The circuit network of claim 1 wherein the tunable circuit includes an RLC circuit.

7. The circuit network of claim 6 wherein the RLC circuit includes the capacitor along the first path, the first resistor along the first path, an inductor along the second path, and the second resistor along the second path.

8. The circuit network of claim 7 wherein the capacitor and the inductor are configured to provide control of the phase of at least one of the first portion and second portion and the first resistor and second resistor are configured to provide control of the amplitude of at least one of the first portion and second portion.

9. The circuit network of claim 1 wherein the balun includes a first inductor coupled between the first node and the second node and a second inductor coupled between the third node and the fourth node.

10. The circuit network of claim 1 further comprising a controller configured to tune the circuit network.

11. The circuit network of claim 10 wherein the controller is configured to tune the circuit network based on a frequency of the RF signal.

12. The circuit network of claim 10 wherein the controller is configured to tune the circuit network such that the amplitude of the first portion and the amplitude of the second portion are unequal.

13. The circuit network of claim 10 wherein the controller is configured to tune the circuit network such that the phase of the first portion and the phase of the second portion are non-orthogonal.

14. The circuit network of claim 10 wherein the controller is configured to tune the circuit network such that harmonics produced by the carrier amplifier and harmonics produced by the peaking amplifier are cancelled by a combiner.

15. The circuit network of claim 10 wherein the controller is configured to perform wide-band linearization of the Doherty power amplifier.

16. A Doherty power amplifier (PA) module comprising:
a packaging substrate configured to receive a plurality of components; and
a Doherty PA system implemented on the packaging substrate, the Doherty PA system including a splitter circuit configured to receive a radio-frequency (RF) signal and split the RF signal into a first portion along a first path to an input of a carrier amplifier and a second portion along a second path to an input of a peaking amplifier, a tunable circuit comprising at least one of a section of the first path and a section of the second path, the tunable circuit configured to provide control of the amplitude and phase of at least one of the first portion and second portion, the tunable circuit including a balun-based circuit, the balun-based circuit including a balun having a first node configured to receive the input signal, a second node coupled to the carrier amplifier via a first resistor, a third node coupled to the peaking amplifier via a second resistor, and a fourth node coupled to a ground potential via a termination impedance, the balun-based circuit further including a first capacitor coupled between the first node and the third node and a second capacitor coupled between the second node and the fourth node, a carrier amplifier configured to amplify the first portion and a peaking amplifier configured to amplify the second portion, and an output circuit configured to combine outputs of the carrier amplifier and the peaking amplifier to yield an amplified RF signal.

17. The Doherty PA module of claim 16 wherein the output circuit includes a tunable impedance circuit.

18. A wireless device comprising:
a transceiver configured to generate a radio-frequency (RF) signal;
a power amplifier (PA) module in communication with the transceiver, the PA module including a packaging substrate configured to receive a plurality of components and a PA system implemented on the packaging substrate, the PA system including a splitter circuit configured to receive a radio-frequency (RF) signal and split the RF signal into a first portion along a first path to an input of a carrier amplifier and a second portion along a second path to an input of a peaking amplifier, a tunable circuit comprising at least one of a section of the first path and a section of the second path, the tunable circuit configured to provide control of the amplitude and phase of at least one of the first portion and second portion, the tunable circuit including a balun-based circuit, the balun-based circuit including a balun having a first node configured to receive the input signal, a second node coupled to the carrier amplifier via a first resistor, a third node coupled to the peaking amplifier via a second resistor, and a fourth node coupled to a ground potential via a termination impedance, the balun-based circuit further including a first capacitor coupled between the first node and the third node and a second capacitor coupled between the second node and the fourth node, a carrier amplifier configured to amplify the first portion and a peaking amplifier configured to amplify the second portion, and an output circuit configured to combine outputs of the carrier amplifier and the peaking amplifier to yield an amplified RF signal; and an antenna in communication with the PA module, the antenna configured to facilitate transmission of the amplified RF signal.

19. The Doherty PA module of claim 16 wherein the balun includes a first inductor coupled between the first node and the second node and a second inductor coupled between the third node and the fourth node.

20. The Doherty PA module of claim 16 wherein the Doherty PA system includes a controller configured to tune the Doherty PA system such that harmonics produced by the carrier amplifier and harmonics produced by the peaking amplifier are cancelled by a combiner.

* * * * *